United States Patent
Liu

(10) Patent No.: US 6,778,396 B2
(45) Date of Patent: Aug. 17, 2004

(54) RETAINING DEVICE FOR HEAT SINK

(75) Inventor: HeBen Liu, Shenzhen (CN)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 0 days.

(21) Appl. No.: 10/321,272

(22) Filed: Dec. 16, 2002

(65) Prior Publication Data

US 2004/0017662 A1 Jan. 29, 2004

(30) Foreign Application Priority Data

Jul. 26, 2002 (TW) ..................................... 91211438 U

(51) Int. Cl.[7] .............................................. H05K 7/20
(52) U.S. Cl. .................. 361/719; 361/704; 361/710; 257/719; 165/80.3
(58) Field of Search ....................... 361/687, 704–707, 361/709–712, 720, 717–719; 29/890.03; 257/718–727; 24/453, 457, 458; 165/80.3, 185; 174/16.3; 248/505, 510

(56) References Cited

U.S. PATENT DOCUMENTS

| | | | |
|---|---|---|---|
| 5,662,163 A | * | 9/1997 | Mira ........................ 165/80.3 |
| 6,229,703 B1 | * | 5/2001 | Lee ............................ 361/704 |
| 6,282,093 B1 | * | 8/2001 | Goodwin ....................... 361/7 |
| 6,549,412 B1 | * | 4/2003 | Ma ............................ 361/704 |
| 6,646,881 B1 | * | 11/2003 | Lai et al. .................... 361/719 |
| 2004/0012927 A1 | * | 1/2004 | Lee et al. ................... 361/719 |

* cited by examiner

Primary Examiner—Michael Datskovsky
(74) Attorney, Agent, or Firm—Wei Te Chung

(57) ABSTRACT

A retaining device for attaching a heat sink (2) to a CPU (3) mounted on a circuit board (4). The retaining device includes a pair of clips (1), a backplate (6), and four pins (5). Each clip includes a central pressing portion (10), two resilient portions (12) adjacent the pressing portion, two shoulders (13) adjacent the resilient portions, and two arms (17). Each shoulder defines first and second cutouts (14a, 14b). Each pin forms a blocking head (50), and a bottom blocking stop (58). The pins are extended through the backplate, the circuit board and the heat sink. The heads are initially received through the first cutouts, and then engaged on the shoulders at the second cutouts. The heads press downwardly on the clips, and the stops press upwardly on the backplate. Thus, the clips and the backplate firmly sandwich the heat sink, the CPU and the circuit board therebetween.

13 Claims, 3 Drawing Sheets

RETAINING DEVICE FOR HEAT SINK

BACKGROUND OF THE INVENTION

1. Field of the Invention

The present invention relates to a retaining device, and more particularly to a retaining device for securing a heat sink to an electronic package such as a central processing unit (CPU).

2. Description of Related Art

With the rapid development of electronics technology, electronic devices such as CPUs are able to process signals at unprecedented high speeds. As a result, CPUs can generate copious amounts of heat. The heat must be efficiently removed from the CPU; otherwise, abnormal operation or damage may result.

Conventionally, a heat sink is attached on a CPU by various types of clips. A popular conventional clip comprises a pressing portion for pressing the heat sink, and a pair of resilient portions extending from opposite ends of the pressing portion. A pair of arms depends from opposite ends of the resilient portions, for engaging with corresponding protrusions mounted at a periphery of the CPU. The heat sink is thus attached on the CPU. However, when the assembly is subjected to vibration or shock during normal use, the heat sink is liable to be horizontally displaced relative to the CPU. This disturbs thermal contact between the heat sink and the CPU. Therefore, the efficiency of heat removal is diminished.

SUMMARY OF THE INVENTION

Accordingly, an object of the present invention is to provide a retaining device for a heat sink which firmly attaches the heat sink to an electronic package such as a CPU and prevents the heat sink from moving horizontally relative to the electronic package.

In order to achieve the object set out above, a retaining device in accordance with a preferred embodiment of the present invention is for attaching a heat sink to a CPU mounted on a circuit board. The retaining device comprises a pair of clips, a backplate, and four pins. Each clip comprises a central pressing portion, two resilient portions extending from opposite ends of the pressing portion, two shoulders extending horizontally from free ends of the resilient portions, and two arms depending from free ends of the shoulders. Each shoulder defines a circular first cutout, and a circular second cutout smaller than and in communication with the first cutout. The backplate defines four holes in four corners thereof. Each pin forms a blocking head at a top end thereof, and a blocking stop at a bottom end thereof. The pins are sequentially extended through the backplate, the circuit board and the heat sink. The heads are initially received through the first cutouts, and then engaged on the shoulders at the second cutouts. The heads press downwardly on the clips, and the stops press upwardly on the backplate. Thus, the clips and the backplate firmly sandwich the heat sink, the CPU and the circuit board therebetween. Good thermal contact between the heat sink and the CPU is thereby attained, for high heat removal efficiency.

Other objects, advantages and novel features of the present invention will become more apparent from the following detailed description when taken in conjunction with the accompanying drawings, in which:

DETAILED DESCRIPTION OF THE INVENTION

Figure 1:
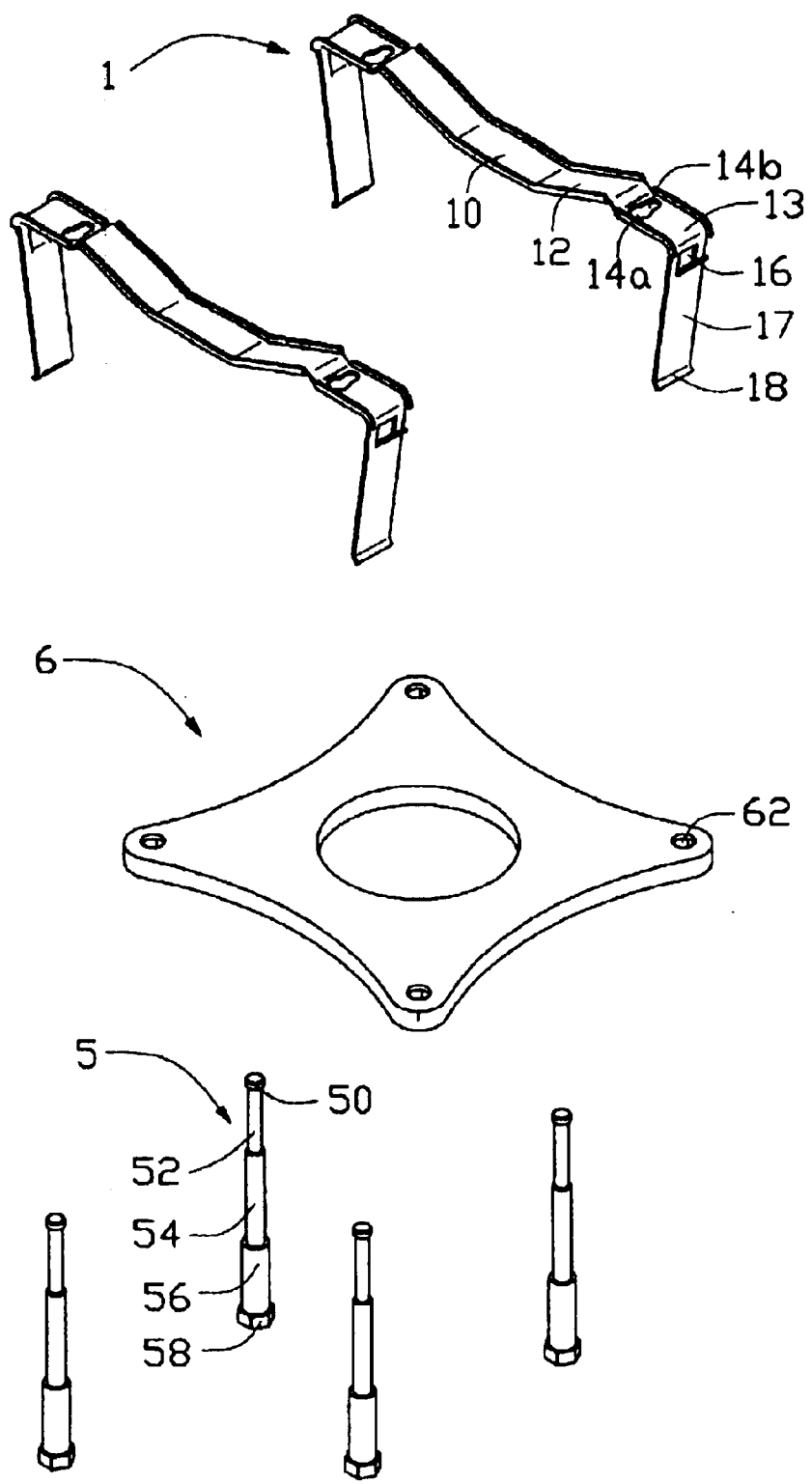
FIG. 1 is an exploded perspective view of a retaining device in accordance with a preferred embodiment of the present invention.
Figure 2:
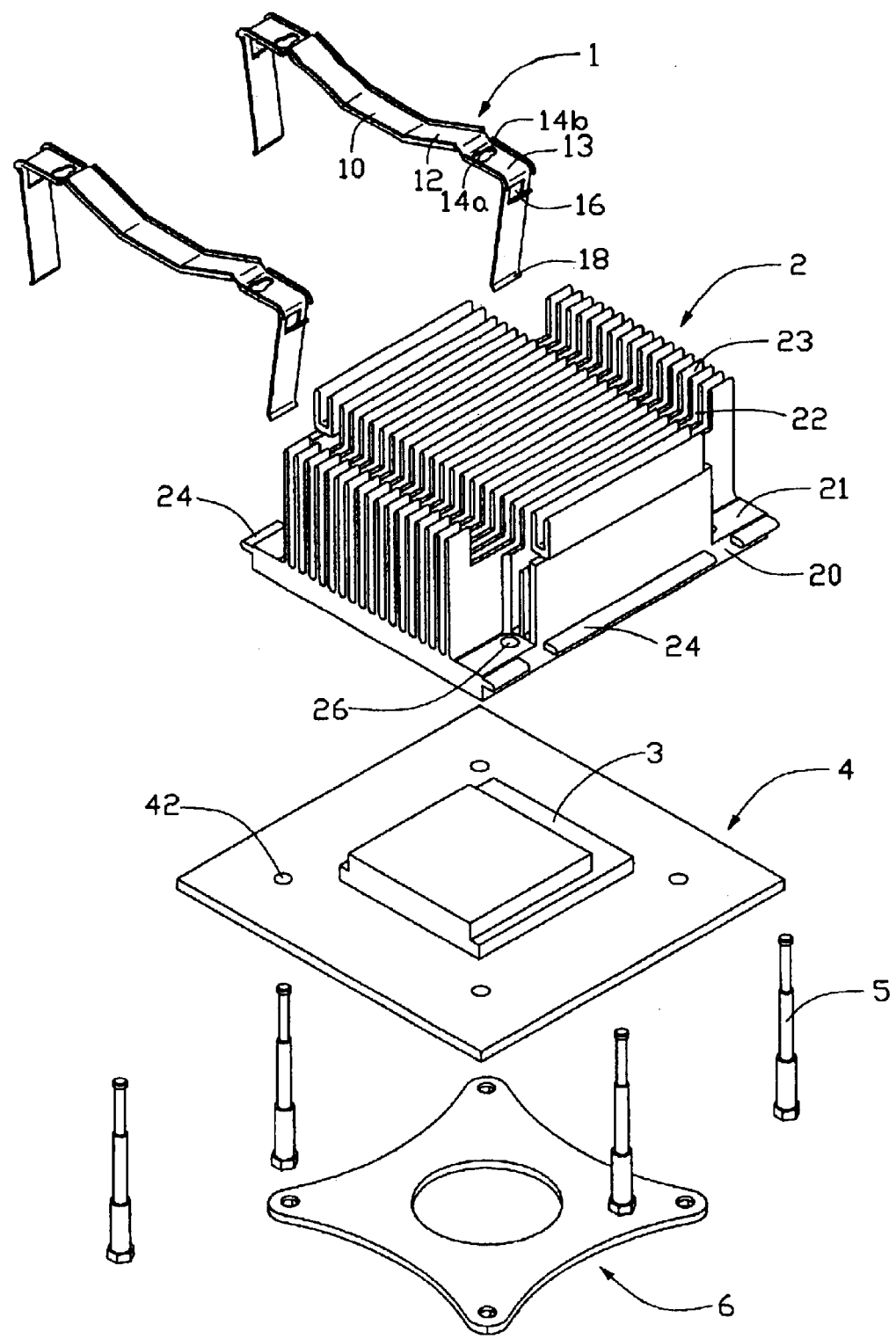
FIG. 2 is an exploded perspective view of the retaining device of FIG. 1, together with a heat sink, and a CPU mounted on a circuit board.
Figure 3:
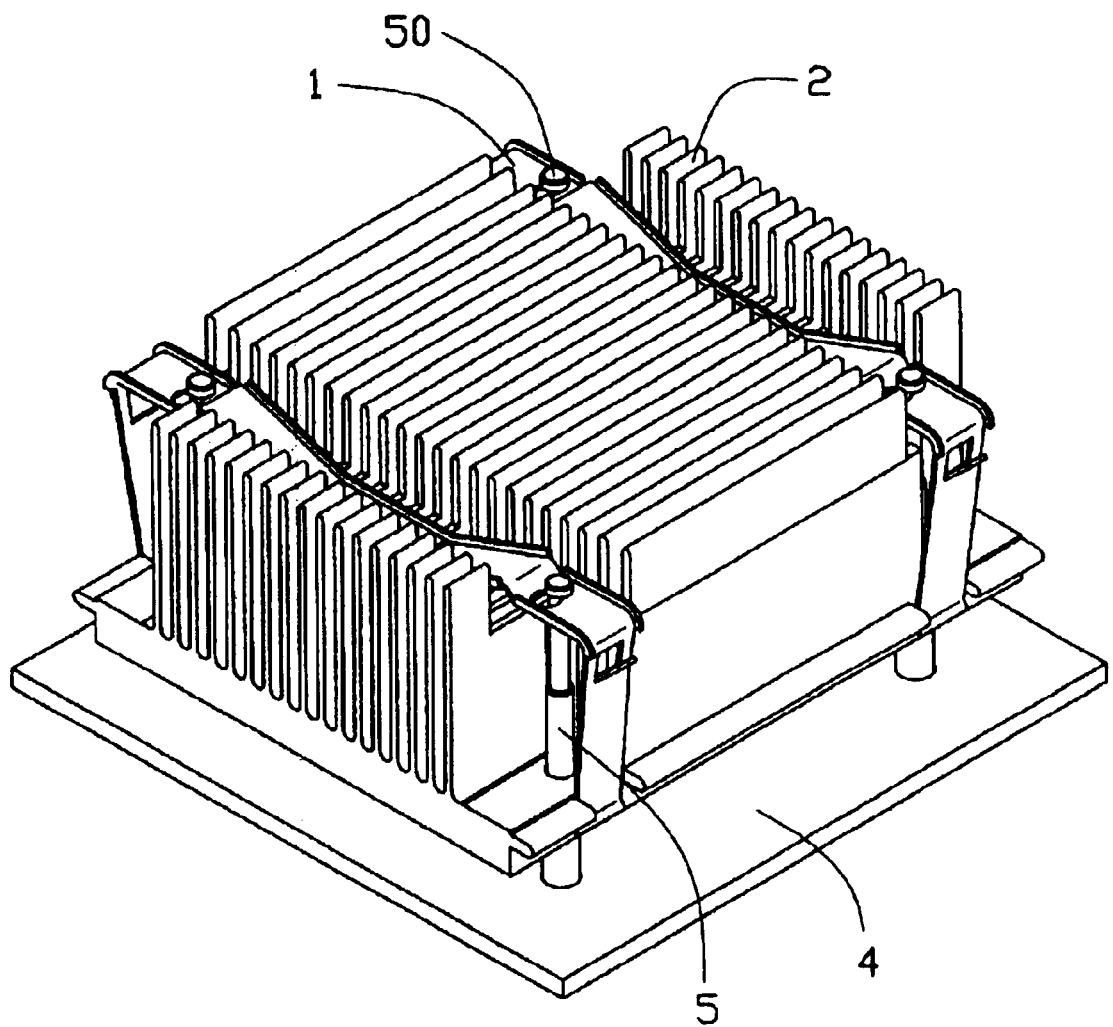
FIG. 3 is an assembled view of FIG. 2.

Referring to FIGS. 1–3, a retaining device in accordance with a preferred embodiment of the present invention comprises a pair of clips 1, four pins 5 and a backplate 6. The clips 1 engage with the pins 5 and the backplate 6 to attach a heat sink 2 on a CPU 3 that is mounted on a circuit board 4.

The circuit board 4 defines four bores 42 around a periphery of the CPU 3. The heat sink 2 comprises a chassis 21, and a plurality of parallel fins 23 extending upwardly from the chassis 21. A pair of flanges 24 is integrally formed at opposite sides of the chassis 21 respectively. A pair of spaced slots 20 is defined in each flange 24. The chassis 21 defines four apertures 26 in four corners thereof respectively, corresponding to the bores 42 of the circuit board 40. A pair of spaced channels 22 is transversely defined through upper portions of the fins 23, in general alignment with corresponding slots 20 of the flanges 24.

Each clip 1 has a central pressing portion 10. A pair of resilient portions 12 extends outwardly and at a slight upward incline from opposite ends of the pressing portion 10 respectively. A pair of shoulders 13 extends horizontally outwardly from free ends of the resilient portions 12 respectively. Each shoulder 13 defines a circular first cutout 14a, and a circular second cutout 14b in communication with the first cutout 14a. The second cutout 14b is smaller than the first cutout 14a. A pair of arms 17 depends at slight inward inclines from free ends of the shoulders 13 respectively. An opening 16 is defined in a top portion of each arm 17, for insertion of a tool thereinto. Each arm 17 comprises an outwardly bent guide portion 18 at a distal end thereof.

Each pin 5 is a stepped shaft, and sequentially comprises from top to bottom: a first step 52, a second step 54 and a third step 56. Said steps 52, 54, 56 sequentially increase in diameter slightly. The first step 52 forms a blocking head 50 at a top end thereof. The third step 56 forms a hexagonal blocking stop 58 at a bottom end thereof.

The backplate 6 defines four stepped holes 62 in four corners thereof respectively, corresponding to the bores 42 of the circuit board 40. The holes 62 are for partly receiving the third steps 56 of the pins 5 therein, and for retaining the stops 58 of the pins 5 therein.

In assembly, the pins 5 are sequentially inserted upwardly through the holes 62 of the backplate 6, the bores 42 of the circuit board 4 and the apertures 26 of the heat sink 2. The third steps 56 of the pins 5 are held in the bores 42, and also support a bottom surface of the chassis 21 of the heat sink 2. The stops 58 of the third steps 56 are retained in the holes 62.

The clips 1 are placed in the channels 22 of the heat sink 2, with the pressing portions 10 of the clips 1 resting on the fins 23 of the heat sink 2. Tools are inserted into the openings 16 of the arms 17 of the clips 1. The arms 17 are deflected outwardly, and the resilient portions 12 of the shoulders 13 of the clips 1 are depressed. The heads 50 of the pins 5 are received through the first cutouts 14a of the shoulders 13, and the guide portions 18 of the arms 17 pass down through the slots 20 of the heat sink 2. The clips 1 are then pushed horizontally, to cause the first steps 52 of the pins 5 to be engagingly received in the second cutouts 14b of the shoulders 13 at the heads 50. Then, the resilient portions 12 of the clips 1 are released. The heads 50 of the pins 5 thereby firmly press downwardly on the shoulders 13 of the clips 1.

The pins 5 of the present invention are inserted through both the bores 42 of the circuit board 4 and the apertures 26 of the heat sink 2. Therefore, the heat sink 2 is securely located relative to the circuit board 4. Accordingly, the heat sink 2 is securely located relative to the CPU 3 that is mounted on the circuit board 4.

The pins 5 of the present invention each have the stop 58 at the bottom end thereof retained in a corresponding hole 62 of the backplate 6, and the head 50 at the top end thereof engaged with a corresponding shoulder 13 of the clip 1 at the second cutout 14b. The heads 50 press downwardly on the clips 1, and the stops 58 press upwardly on the backplate 6. Thus, the clips 1 and the backplate 6 firmly sandwich the heat sink 2, the CPU 3 and the circuit board 4 therebetween. Good thermal contact between the heat sink 2 and the CPU 3 is thereby attained, for high heat removal efficiency.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A retaining device for a heat sink comprising:
   a clip having a pressing portion, two resilient portions extending from opposite ends of the pressing portion, and two shoulders extending from the resilient portions, the shoulders each defining a cutout therein, wherein two arms depend from the shoulders of the clip respectively;
   a backplate defining two holes therein; and
   two pins each having a head engaged with a corresponding shoulder at the cutout, and a stop retained in a corresponding hole of the backplate.

2. The retaining device of claim 1, wherein an opening is defined in each of the arms, for insertion of a tool thereinto.

3. The retaining device of claim 1, wherein the cutout comprises a first portion and a second portion in communication with the first portion, the second portion being smaller than the first portion.

4. The retaining device of claim 1, wherein the pins each sequentially comprise a first step, a second step and a third step, the steps sequentially increasing in diameter slightly.

5. The retaining device of claim 4, wherein the head is formed at a distal end of the first step, and the stop is formed at a distal end of the third step.

6. A heat dissipation assembly comprising:
   a circuit board supporting an electronic package thereon;
   a heat sink located on the electronic package; and
   a retaining device comprising a clip engaged on the heat sink, a backplate engaged under the circuit board, and two pins, the pins sequentially extending through the backplate, the circuit board and the heat sink and engaging with the clip thereby resiliently attaching the heat sink to the electronic package;
   wherein a pair of flanges is integrally formed at opposite sides of the heat sink, each of the flanges defines a slot therein, the clip has a pair of arms at opposite sides thereof, and the arms are received through the slots.

7. The heat dissipation assembly of claim 6, wherein the backplate defines two holes therein, the circuit board defines two bores therein, and the heat sink defines two apertures therein, the pins sequentially extending through the holes, the bores and the apertures.

8. The heat dissipation assembly of claim 6, wherein the pins each have a head and a stop at opposite ends thereof respectively, and the head presses on the clip and the stop presses on the backplate respectively in opposite directions.

9. The heat dissipation assembly of claim 8, wherein the clip has a pressing portion and a pair of shoulders extending away from the pressing portion.

10. The heat dissipation assembly of claim 9, wherein each of the shoulders defines a first cutout and a second cutout smaller than and in communication with the first cutout, the head of each of the pins is initially received through a corresponding first cutout, and is then engaged with a corresponding shoulder at the second cutout.

11. The heat dissipation assembly of claim 6, wherein a channel is defined in the heat sink, the channel receiving the clip therein.

12. The heat dissipation assembly of claim 8, wherein the pins each comprise a wide stepped portion above the stop, the stepped portion supporting the heat sink thereon.

13. A heat sink assembly comprising:
   a printed circuit board;
   an electronic package assembly mounted upon one face of the printed circuit board;
   a heat sink seated upon the electronic package assembly and defining therein a channel along a first direction; and
   a retaining device including;
   an elongated clip received in the channel;
   a back plate located on the other face of the printed circuit board with at least one pin extending therefrom through said printed circuit board and said heat sink and into the channel;
   the clip extending along said first direction and defining two sets of first and second cutouts located respectively in two spaced horizontal shoulders around two opposite end portions of the clip and communicating with each other along a second direction perpendicular to said first direction; wherein
   via deflection of the clip toward the heat sink, a head of said at least pin initially extends through the first cutout in a third direction perpendicular to both said first and second direction, and successively moves along the second direction to be latchably engaged with the second cutout, so as to secure the heat sink to the electronic package assembly; wherein
   a center pressing portion and two upwardly slanting resilient portions by two sides of the center pressing portion are commonly located between the two spaced shoulders, under a condition that the center pressing portion abuts against the heat sink and the two slanting resilient portions are respectively neighbored and connected with the corresponding shoulders.

* * * * *